(12) United States Patent
Ozguz et al.

(10) Patent No.: US 7,902,879 B2
(45) Date of Patent: Mar. 8, 2011

(54) FIELD PROGRAMMABLE GATE ARRAY UTILIZING DEDICATED MEMORY STACKS IN A VERTICAL LAYER FORMAT

(75) Inventors: Volkan H. Ozguz, Aliso Veijo, CA (US); Randolph S. Carlson, Carson City, NV (US); Keith D. Gann, Tustin, CA (US); John Leon, Anaheim, CA (US); W. Eric Boyd, San Clemete, CA (US)

(73) Assignee: Aprolase Development Co., LLC, Wilmington, DE (US)

( * ) Notice: Subject to any disclaimer, the term of this patent is extended or adjusted under 35 U.S.C. 154(b) by 0 days.

(21) Appl. No.: 12/639,625

(22) Filed: Dec. 16, 2009

(65) Prior Publication Data

US 2010/0148822 A1 Jun. 17, 2010

Related U.S. Application Data

(63) Continuation of application No. 11/897,938, filed on Aug. 31, 2007, now Pat. No. 7,649,386, which is a continuation-in-part of application No. 11/037,490, filed on Jan. 18, 2005, now Pat. No. 7,265,579, which is a continuation of application No. 10/347,038, filed on Jan. 17, 2003, now Pat. No. 6,856,167.

(60) Provisional application No. 60/348,852, filed on Jan. 17, 2002.

(51) Int. Cl.
*H01L 25/00* (2006.01)
*H03K 19/00* (2006.01)

(52) U.S. Cl. .............................. 326/101; 326/41; 326/47

(58) Field of Classification Search .............. 326/38–39, 326/41, 47, 101
See application file for complete search history.

(56) References Cited

U.S. PATENT DOCUMENTS

| | | | |
|---|---|---|---|
| 5,793,115 A * | 8/1998 | Zavracky et al. | ............. 257/777 |
| 5,953,588 A | 9/1999 | Camien et al. | |
| 6,044,481 A | 3/2000 | Kornachuk et al. | |
| 6,049,222 A | 4/2000 | Lawman | |
| 6,072,234 A | 6/2000 | Camien et al. | |
| 6,421,813 B1 | 7/2002 | Jeddeloh | |
| 6,526,559 B2 | 2/2003 | Schiefele et al. | |
| 6,627,985 B2 | 9/2003 | Huppenthal et al. | |
| 6,781,226 B2 | 8/2004 | Huppenthai et al. | |
| 6,856,167 B2 | 2/2005 | Ozguz et al. | |
| 7,082,592 B1 | 7/2006 | Tharmalingam | |
| 7,242,082 B2 | 7/2007 | Edie | |
| 7,649,386 B2 * | 1/2010 | Ozguz et al. | .................. 326/101 |
| 2003/0221313 A1 | 12/2003 | Gann | |

OTHER PUBLICATIONS

Ouaiss, I, et al., "Hierarchical memory mapping during synthesis in FPGA-based reconfigurable computers," *IEEE*, Mar. 2001, pp. 650-657.

* cited by examiner

*Primary Examiner* — Anh Q Tran

(57) ABSTRACT

A field programmable gate array, an access lead network coupled to the FPGA, and a plurality of memories electrically coupled to the access lead network. The FPGA, access lead network, and plurality of memories are arranged and configured to operate with a variable word width, namely with a word width between 1 and a maximum number of bits. The absolute maximum word width may be as large as m*N where m is the number of word width bits per memory chip and N is the number of memory chips.

32 Claims, 6 Drawing Sheets

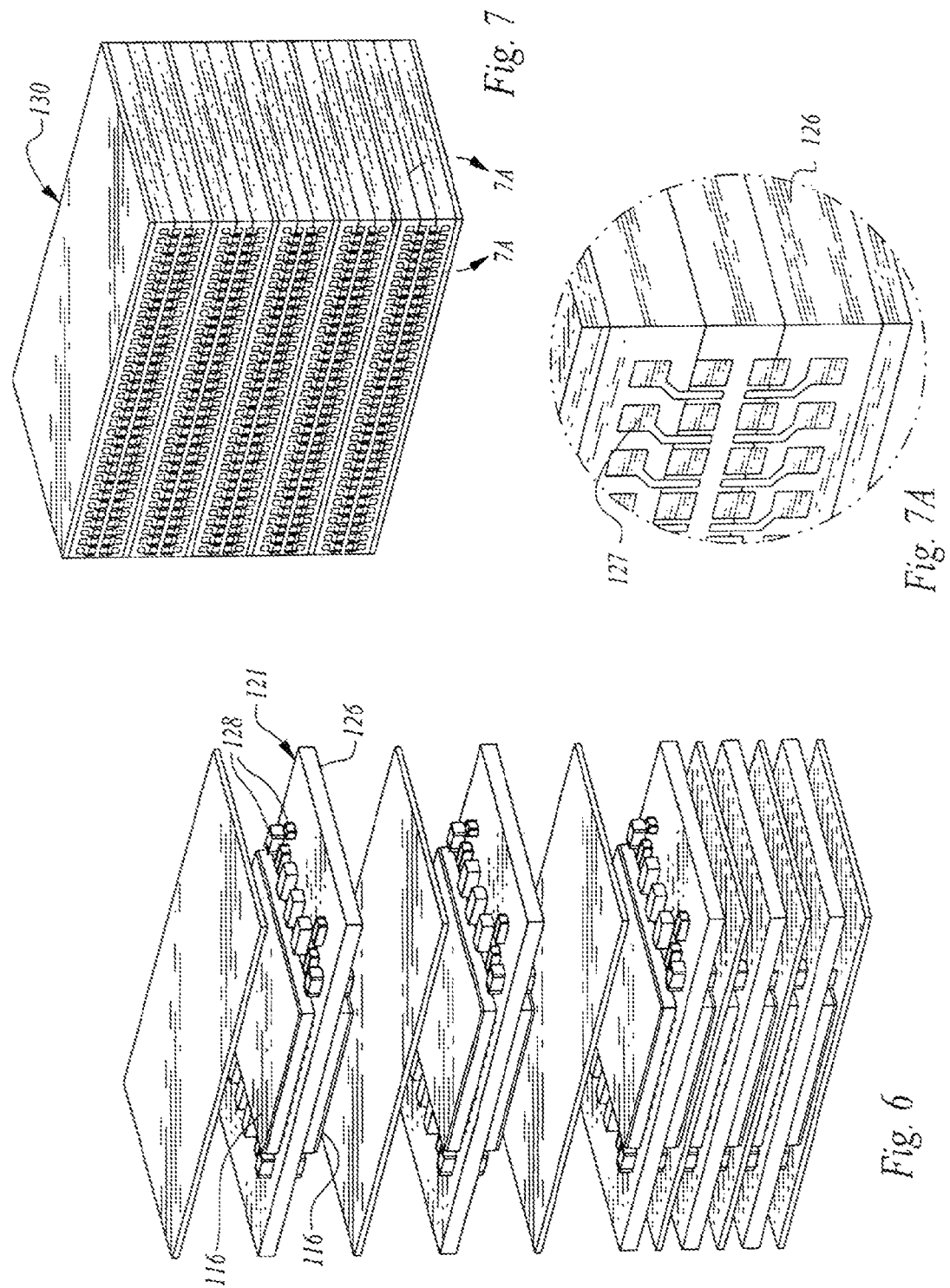

FIELD PROGRAMMABLE GATE ARRAY UTILIZING DEDICATED MEMORY STACKS IN A VERTICAL LAYER FORMAT

CROSS-REFERENCE TO RELATED APPLICATIONS

The present application is a continuation of U.S. patent application Ser. No. 11/897,938, filed Aug. 31, 2007 now U.S. Pat. No. 7,649,386, which is a continuation-in-part of U.S. patent application Ser. No. 11/037,490, filed Jan. 18, 2005 (now U.S. Pat. No. 7,265,579), which in turn is a continuation of U.S. patent application Ser. No. 10/347,038, filed Jan. 17, 2003 (now U.S. Pat. No. 6,856,167), which in turn claims the benefit of U.S. Provisional Patent Application No. 60/348,852, filed on Jan. 17, 2002. The following applications are incorporated by reference herein in their entireties: U.S. patent application Ser. No. 11/897,938; U.S. patent application Ser. No. 11/037,490; U.S. patent application Ser. No. 10/347,038; and U.S. Provisional Patent Application No. 60/348,852.

BACKGROUND

The invention relates to an electronic module and in particular to a combination of an external stacked memory module with a field programmable gate array.

Of the many varieties of integrated circuits available on the market today, field programmable gate arrays (FPGAs) are particularly useful when building many kinds of electronic devices and systems. Because FPGAs allow the designer to integrate complex logic that is peculiar to an application in one or perhaps a few integrated circuits without suffering the cost, delay and risk that typically are incurred when designing a custom integrated circuit, use of FPGAs greatly reduce both design cost and time-to-market for new products.

Not withstanding the great utility of FPGAs, there exist several limitations to the usefulness of these devices. As suggested by FIG. 1, one of the limitations is that FPGAs are typically designed based on a design rule that assumes a fixed and limited word width which is particularly limiting when used in combination with a large amount of memory in high performance applications such as data processing and networking. Further, when the FPGA is used to read from and write into a memory array that is arranged in a typical planar fashion, a considerable amount of space on the printed circuit board is required in order to physically provide for the combination of the FPGA and the memory. Even when space is available for a large planar area that supports the FPGA and surrounding memory, large areas inherently increase parasitic and degrade performance.

What is needed is some type of packaging concept for an FPGA and associated memory array which overcomes these limitations in the prior art.

BRIEF SUMMARY

A representative embodiment of the invention includes a field programmable gate array, an access lead network coupled to the FPGA, and a plurality of memories electrically coupled to the access lead network. The FPGA, access lead network, and plurality of memories are arranged and configured to operate with a variable word width, namely with a word width between 1 and a maximum number of bits. The absolute maximum word width may be as large as m*N (m times N) where m is the number of word width bits per memory chip and N is the number of memory chips.

A first preferred embodiment of the invention is an apparatus comprising a field programmable gate array (FPGA), an access lead network formed from an interposer board electrically coupled and proximate to the FPGA, and a plurality of memories electrically coupled and proximate to the interposer board on an opposite side thereof to the FPGA.

The FPGA is coupled to the interposer board through a first ball grid array. The plurality of memories are coupled to the interposer board through a second ball grid array. The plurality of memories are preferably stacked to collectively form a memory block having an upper and lower contact surface and where the second ball grid array is disposed on both the upper and lower contact surfaces. Whether the ball grid arrays are disposed on the memory block, the interposer board or the FPGA is a matter of choice and convenience. Hence, although it may later be stated, for example, that the first ball array is disposed on the interposer board, it is equivalent to state that the first ball array is disposed on the FPGA or both. For the purposes of this specification any statement that a ball grid array is disposed on one of two adjacent structures should be understood as meaning that the ball grid array is disposed on the other one of the two adjacent structures or both.

The apparatus further comprises a plurality of interleaved lines. The portion of the second ball grid array on the upper contact surface is directly coupled to the interposer board and where the portion of the second ball grid array on the lower contact surface is coupled to the interposer board through the plurality of interleaved lines.

The apparatus further comprises an insulatively filled layer disposed between adjacent ones of the plurality of memories in which layer the interleaved lines are disposed.

The apparatus further comprises at least one resistor and capacitor combination coupled to a corresponding one of the plurality of memories, the resistor and capacitor combination being disposed in the insulatively filled layer.

It is to be expressly understood that an embodiment also includes the method of fabricating the apparatus disclosed above.

A second preferred embodiment of the invention is an apparatus comprising a field programmable gate array (FPGA), an access lead network formed from an interposer board electrically coupled and proximate to the FPGA, and a plurality of memories electrically coupled and proximate to the interposer board on the same side thereof as the FPGA.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112. The invention can be better visualized by turning now to the following drawings wherein like elements are referenced by like numerals.

BRIEF DESCRIPTION OF THE DRAWINGS

FIG. 6 is an exploded perspective view of a memory stack used in the memory enhanced gate array of FIG. 5.

FIG. 7 is a perspective view and close-up enlargement of a memory enhanced gate array of FIG. 5.

The invention and its various embodiments can now be better understood by turning to the following detailed description of the preferred embodiments which are presented as illustrated examples of the embodiments defined in the claims. It is expressly understood that the embodiments as defined by the claims may be broader than the illustrated embodiments described below.

DETAILED DESCRIPTION

Figure 1:
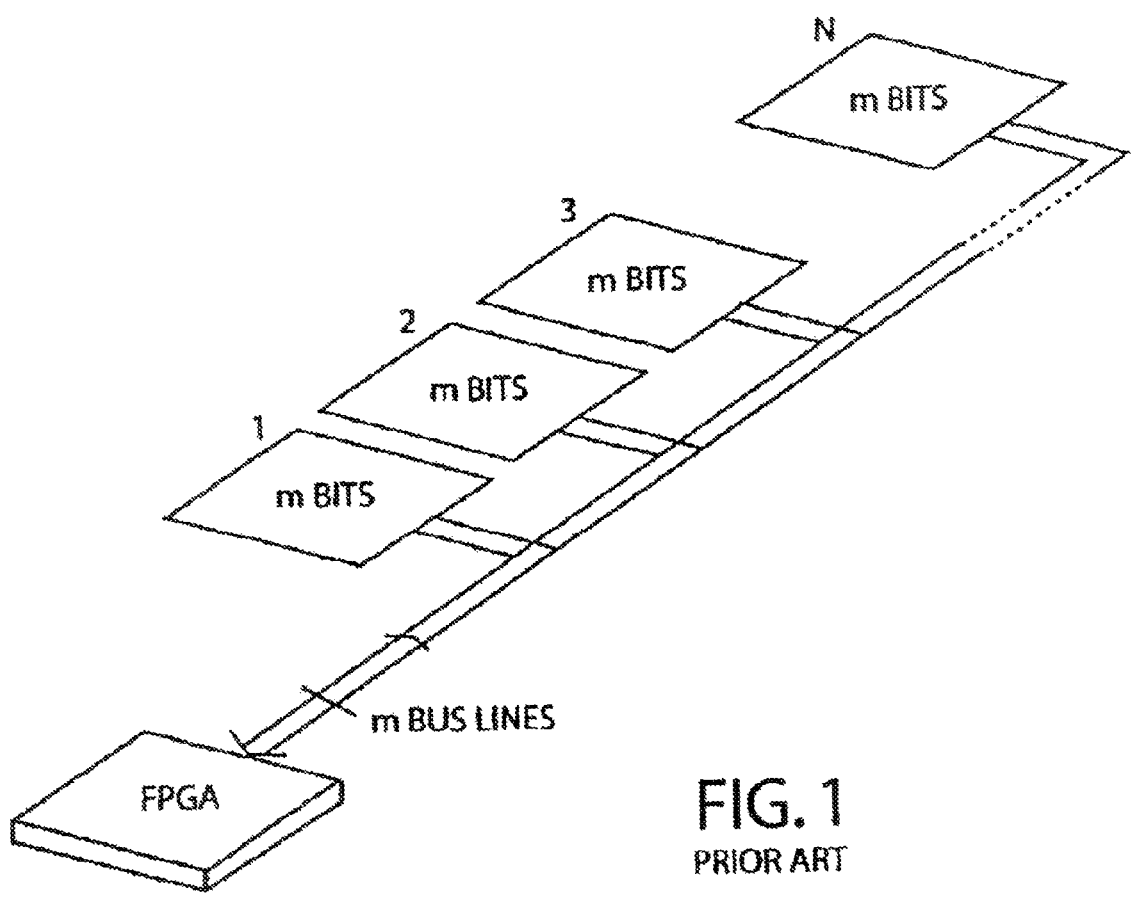
FIG. 1 is a simplified schematic view of a conventional bused interface between an FPGA and a planar-arranged memory array where the word width is fixed and limited to a physical bus width of only m-bits.
Figure 2:
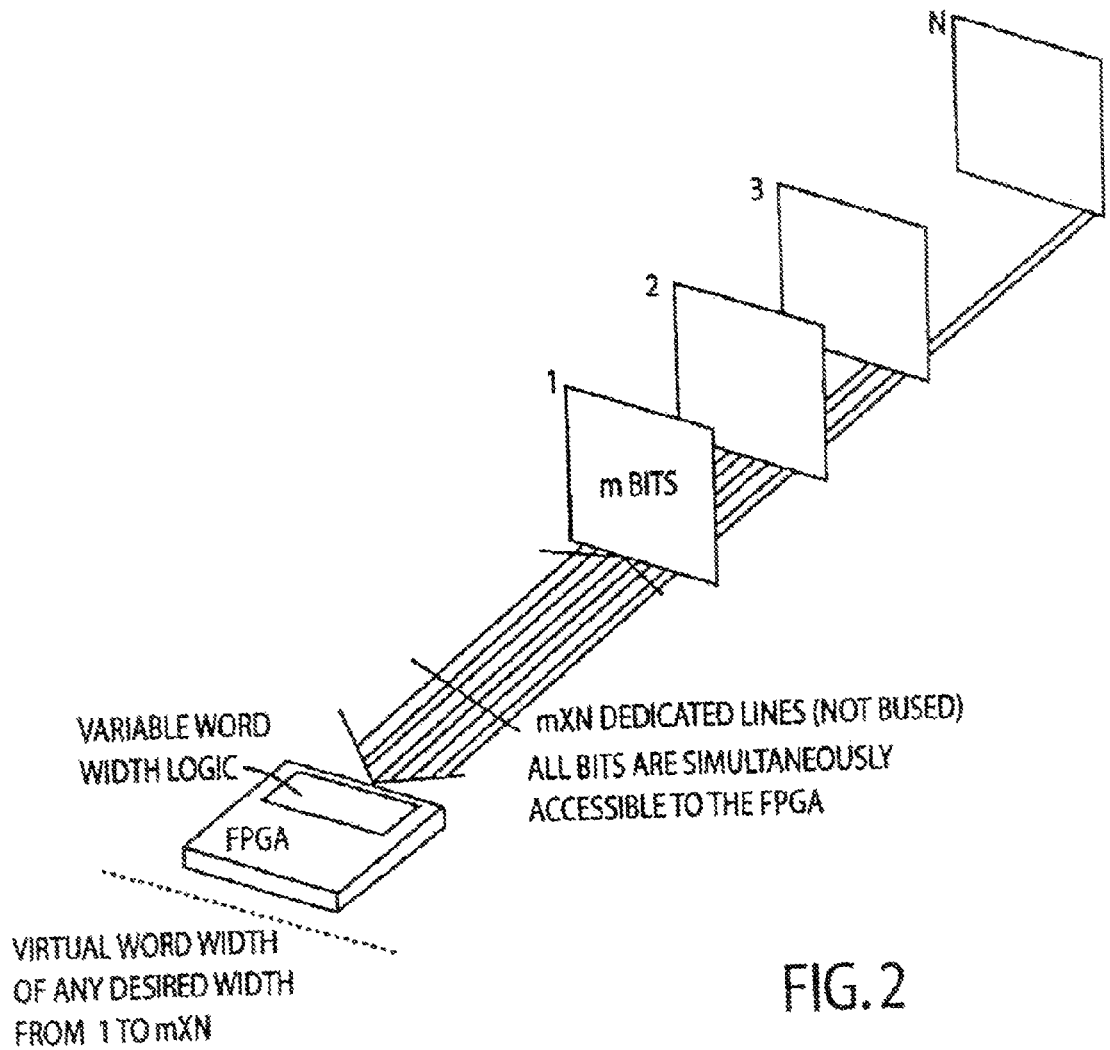
FIG. 2 is a simplified schematic view of a memory enhanced gate array according to a generalized embodiment of this invention where all memory bits are simultaneously available to the FPGA such that the FPGA, incorporating suitable logic, can implement a virtual word with of any desired width from 1 to m*N bits.

FIG. 2 is a simplified schematic view of a memory enhanced gate array according to a generalized embodiment of this invention a field programmable gate array (FPGA) has simultaneous access to all memory bits such that the FPGA, incorporating suitable logic, can implement a virtual word with of any desired width from 1 to m*N bits. Various particular embodiments are possible, two of which will now be discussed.

Figure 3:
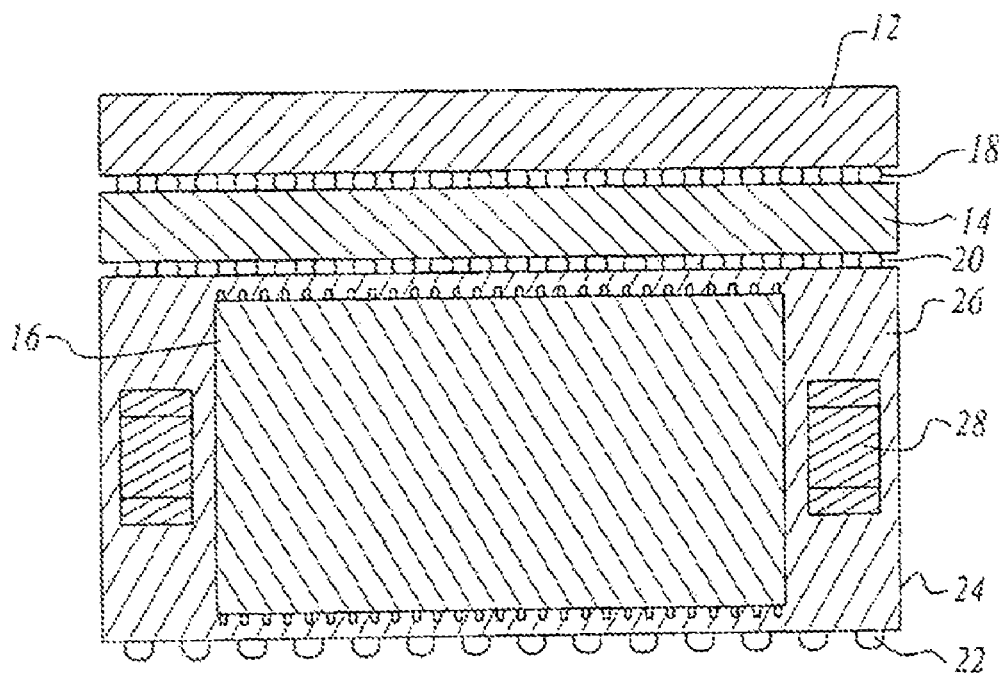
FIG. 3 is a diagrammatic end view of a memory enhanced gate array according to a first preferred embodiment of the invention.
Figure 4:
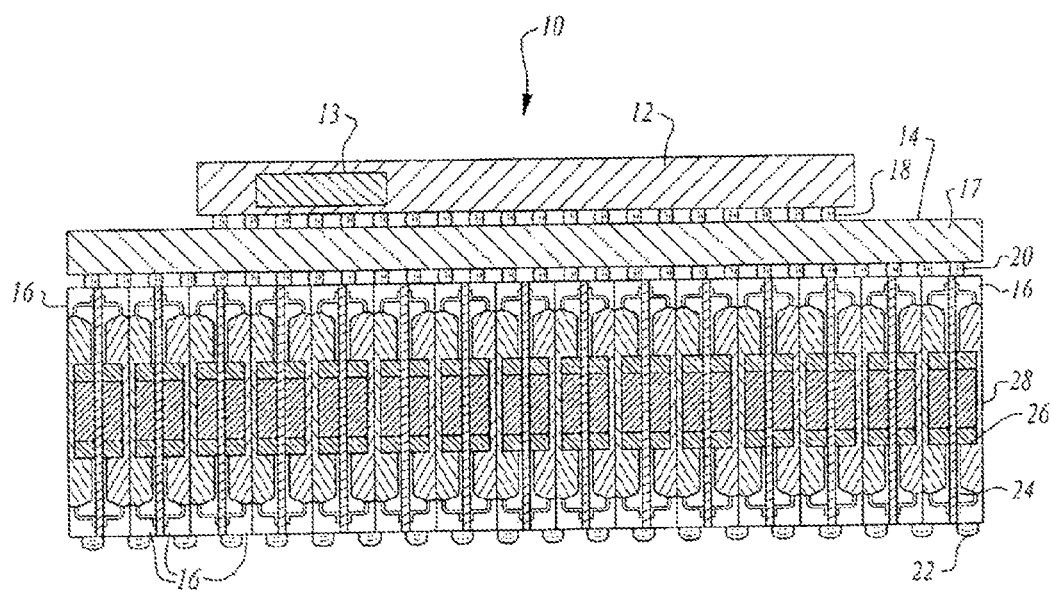
FIG. 4 is a diagrammatic side view of the memory enhanced gate array of FIG. 3.

FIGS. 3 and 4 relate to a first preferred embodiment where an FPGA is coupled to an access lead network formed, in this particular case, by a proximate interposer board and a first ball grid array. A plurality of memories are coupled to the proximate interposer board through a second ball grid array. As discussed above, the FPGA operates with a variable word width. The plurality of memories are stacked to form a memory block. Each individual access lead to the memory in each layer of the memory stack is brought to the edge of the stack. Therefore, the FPGA can connect to a large memory array at any desired word width from 1 to m*N, i.e., from 1 to the maximum number of bits in the memory array. The second ball grid array is disposed on both the upper and lower contact surfaces of the memory block. The portion of the second ball grid array on the upper contact surface is directly coupled to the interposer board. The portion of the second ball grid array on the lower contact surface is coupled to the interposer board through a plurality of interleaved lines. An insulatively filled layer is disposed between adjacent ones of the plurality of memories in which layer the interleaved lines are disposed.

The first preferred memory enhanced gate array 10 is illustrated in a diagrammatic assembled end view in FIG. 3 and in a diagrammatic assembled side view in FIG. 4. The memory enhanced gate array 10 is fabricated using a stacked architecture such as that developed by Irvine Sensors and generally described in Irvine Sensors issued patents. Stacked architectures are characterized by high port density and low power consumption. As shown in FIGS. 3 and 4 a field programmable gate array (FPGA) 12 is disposed on a first side of an interposer board 14 through a conventional ball grid array 18 connection therebetween. Any FPGA now available or later devised may be used.

In this particular embodiment, the interposer board 14 that forms the access lead network is an insulating printed circuit board having a first surface (the topside in the picture) with a contact pattern arranged and configured to connect to the ball grid array 18 of FPGA 12 and having a plurality of vias 17 defined therethrough connecting ball grid array 18 with a contact pattern arranged and configured to connect to the ball grid array 20 on a second surface (the underside in the picture).

Disposed adjacent the second side of the interposer 14 in an edgewise fashion are a plurality of memory integrated circuits 16. Memory integrated circuits 16 are organized in a "loaf fashion", that is each circuit 16 is thought of as a "slice of bread" stacked together to collectively form a "loaf" with a first side of the loaf in contact with interposer board 14. Greater detail concerning the "loaf" architecture is disclosed in U.S. patent application Ser. No. 10/339,023 (pending), filed on Jan. 9, 2003, and entitled "METHOD FOR MAKING STACKED INTEGRATED CIRCUITS (ICs) USING PRE-PACKAGED PARTS", which is incorporated herein by reference. In the illustrated embodiment, the memory integrated circuits 16 are synchronous dynamic random access memories (SDRAMs).

The leads of memory integrated circuits 16 are connected directly to ball grid array 20 in the case of the leads exiting memory integrated circuits 16 on first ends of memory integrated circuits 16 near interposer board 14 and through interleaved lines 24 between memory integrated circuits 16 in the case of leads on the lower ends of memory integrated circuits 16 disposed away from interposer board 14. The interleaved lines 24 are connected to ball grid array 22 on a second surface (the bottom as shown) of memory enhanced gate array 10 which in turn are coupled to the leads of memory integrated circuits 16 disposed away from interposer board 14. Interleaved lines 24 are then led upward through an insulatively filled layer 26 and connected into ball grid array 20 next to the upper ends of integrated circuits 16 adjacent to interposer board 14. Also included in layer 26 is a conventional discrete or integrated circuit resistor and capacitor combination 28 coupled in a conventional manner with integrated circuits 16 to optimize memory speed.

An FPGA 12 used in connection with an embodiment may be arranged and configured as disclosed in U.S. Pat. No. 7,082,591 filed on Jan. 17, 2003, entitled "METHOD FOR EFFECTIVELY EMBEDDING VARIOUS INTEGRATED CIRCUITS WITHIN FIELD PROGRAMMABLE GATE ARRAYS", which is incorporated herein by reference. As there disclosed, FPGA 12 operates with a parameterized word width which can be configured or field programmed as suggested by block 13 labeled "variable word with logic." Hence, in the illustrated embodiment, the memory block of memory enhanced gate array 10 operates so that the memory is addressable in word widths of 1 to m*N bits.

It is a further advantage that FPGA 12 and more importantly, its leads are in very close proximity to the addressable leads of memories 16, thereby avoiding a host of timing and capacitance problems that can arise when the FPGA and the memory array are separated by substantially longer line lengths as occurs on a conventional flat or planar printed circuit board layout.

There is no bus-width related processor-to-memory bottleneck with the architecture of embodiments of the invention and there is negligible response skew as compared with a hypothetical, simultaneous connection to multiple memory chips arranged on a planar substrate. In a conventional bussed and planar arrangement of memory, the maximum transfer rate is m bits multiplied by the clock speed. In a memory enhanced gate array according to an embodiment, however, the maximum transfer rate is m*N bits times the clock rate. Skew is minimized because the equal lead length topology associated with the embodiments of this invention makes it unnecessary to account for different response times to differently located memory circuits.

Figure 5:
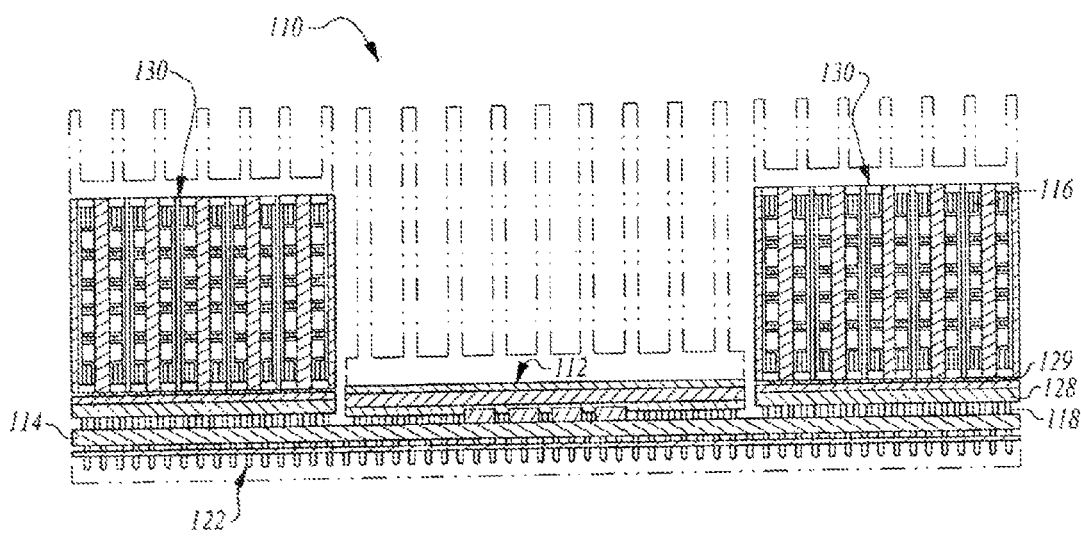
FIG. 5 is a diagrammatic end view of a memory enhanced gate array according to a second preferred embodiment of the invention.

Further, a representative embodiment includes a "virtual" memory modularity and a hidden memory-to-pin configuration. The virtual memory modularity arises from the fact that an embodiment of the invention permits m*N bits of memory to be accessed in any desired word with from 1 bit to m*N bits. By way of example, sixteen 1 GB memory chips that are 18 bits wide could be addressed as any one of the following configurations, and more:

1 GB memory with 18*16 word width
2 GB memory with 18*8 word width
4 GB memory with 18*4 word width
16 GB memory with 18*1 word width FIGS. 5 to 7 illustrate a memory enhanced gate array 110 according to a second preferred embodiment of the invention. The embodiment is still an apparatus comprising a field programmable gate array (FPGA) 112, an access lead network formed from an interposer board 114 electrically coupled and proximate to the FPGA, and a plurality of memory electronic integrated circuits 116 that electrically coupled and proximate to the interposer board. There are, however, certain implementation differences.

For example, the memory ICs 116 are ball grid array (BGA) packages and they are connected (through a printed circuit board 121 and a connector 128) to the same side of the interposer board 114 as the FPGA 112. As better shown in FIG. 6, the second embodiment 110 features PCB Assemblies 121 where the memory ICs 116 are mounted to opposite sides of the printed circuit board 126 with resistors and capacitors 128 as required. As suggested by FIG. 6, the PCB assemblies 121 are suitably arranged to form an overall memory stack 130. Two such stacks 130, 130 are disposed on either side of the FPGA 112 as shown in FIG. 5, but fewer or more stacks may be used.

As shown in FIG. 7, the memory stacks 130 are complete by introducing an encapsulation material 126 between the layers of the stack, and then using suitable metallization techniques to form I/O pads 127 on the resulting planar surface of the stack 130. The UO pads 127 of the finished stack are ultimately mated to a connector 128 using conventional BGA connectors 129 as shown in FIG. 5.

Another difference between the first and second embodiments is that in the second embodiment, as shown in FIG. 5, the memory stacks 130 are connected to the interposer board 114 with a pin grid array 118 rather than directly to the interposer with a ball grid array. The overall memory enhanced gate array 110 is also connected to a user board with a pin grid array 122 rather than with a ball grid array. The foregoing electromechanical interconnection between the FPGA, the memories and the user board are just two examples and any desired method of interconnection may be used.

It is possible, of course, to couple the plurality of memories to the FPGA at a die level, using suitable metallization techniques, rather than using a discrete interposer board as in the first two embodiments.

Figure 8:
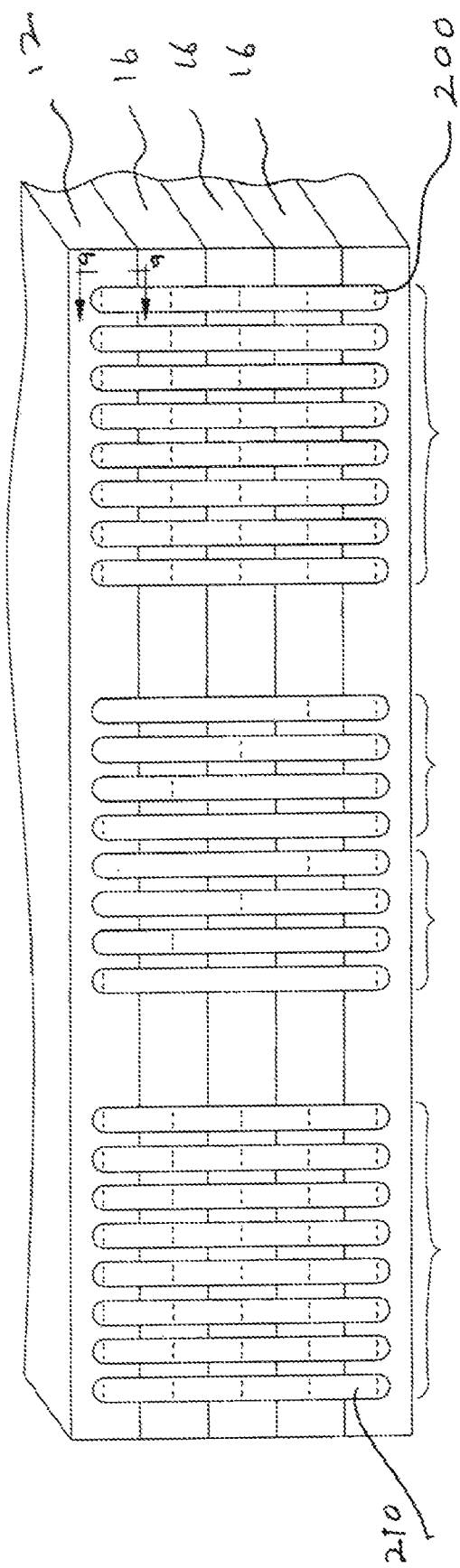
FIG. 8 is a side view of a memory enhanced gate array module in a vertically layered configuration.

FIG. 8 illustrates an alternative preferred embodiment wherein the various ICs are bonded and stacked in a vertical direction much like the layers in a layer cake. Interposer layering have conductive rerouting for rerouting electrical connections to the edge and upon the lateral surfaces of the stack may be used where appropriate as, for instance, shown in U.S. Pat. Nos. 7,242,082 and 7,082,591, each to assignee herein, Irvine Sensors Corp. and each of which is incorporated fully herein by reference.

Figure 9:
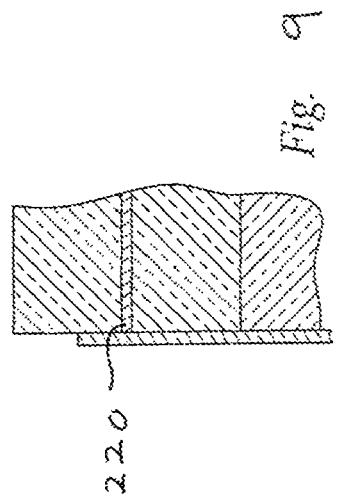
FIG. 9 is a cross-sectional view of a T-connect of an embodiment of the invention.

As seen in FIG. 8 showing an exemplar embodiment, at least one FPGA 12 is vertically stacked with one or more memories. The I/O 200 of the respective layers are brought to a lateral edge of the stack and the layers electrically connected by means of metallized traces 210 on a lateral surface using the T-connect structure 220 of FIG. 9.

In yet a further alternative embodiment, not shown, the various IC die in the stack may be configured, bonded and rerouted in a "neo-stack" of encapsulated "neo-chips" as is set forth in U.S. Pat. Nos. 6,072,234, and 5,953,588 each to assignee herein Irvine Sensors Corp., which patents are frilly incorporated herein by reference.

Many other alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that various embodiments of the invention include other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

The invention claimed is:

1. An electronic module comprising:
   a field-programmable gate array (FPGA);
   an access lead network electrically connected to the FPGA;
   a stack of integrated circuits electrically connected to the access lead network; and
   a plurality of input/output (I/O) terminals disposed on a surface of the stack, wherein the I/O terminals are configured to route electrical signals between the stack and the access lead network.

2. The electronic module of claim 1, wherein the stack of integrated circuits comprises a stack of memory circuits.

3. The electronic module of claim 1, wherein the FPGA is configured to operate with a variable word width.

4. The electronic module of claim 3, wherein the variable word width is between 1 and m*N bits, where m represents a number of bits in a word width of each integrated circuit and N represents the total number of the integrated circuits.

5. The electronic module of claim 1, further comprising a first ball grid array configured to electrically connect the access lead network to the FPGA and a second ball grid array configured to electrically connect the stack of integrated circuits to the FPGA.

6. The electronic module of claim 1, further comprising a metallized trace configured to electrically connect at least one of the plurality of I/O terminals to the FPGA.

7. The electronic module of claim 6, wherein the at least one of the plurality of I/O terminals is electrically connected to the metallized trace by a T-connect structure.

8. The electronic module of claim 1, wherein the stack of integrated circuits comprises a stack of printed circuit board (PCB) assemblies, wherein each integrated circuit of the stack of integrated circuits is connected to a PCB assembly of the stack of PCB assemblies.

9. An electronic module comprising:
   a field-programmable gate array (FPGA) electrically connected to a plurality of memory integrated circuits arranged in a stack, wherein the FPGA is configured to simultaneously access each of the plurality of memory integrated circuits and thereby operate with a variable word width.

10. The electronic module of claim 9, wherein the variable word width is between 1 and m*N bits, where m represents a number of bits in a word width of each memory integrated circuit and N represents the total number of the memory integrated circuits.

11. The electronic module of claim 9, further comprising an access lead network configured to electrically connect the FPGA to the plurality of memory integrated circuits.

12. The electronic module of claim 11, wherein the electronic module further comprises a plurality of input/output (I/O) terminals disposed on a surface of the stack, wherein the plurality of I/O terminals are configured to route electrical signals between the plurality of memory integrated circuits and the access lead network.

13. The electronic module of claim 12, further comprising a metallized trace configured to electrically connect at least one of the plurality of I/O terminals to the FPGA.

14. The electronic module of claim 13, further comprising a T-connect structure configured to electrically connect the at least one of the plurality of I/O terminals to the metallized trace.

15. The electronic module of claim 11, further comprising a first ball grid array configured to electrically connect the access lead network to the FPGA and a second ball grid array configured to electrically connect the stack of memory integrated circuits to the FPGA.

16. The electronic module of claim 9, wherein the stack comprises a plurality of printed circuit board (PCB) assemblies, wherein the plurality of memory integrated circuits is connected to the plurality of PCB assemblies.

17. A method comprising:
   electrically connecting a field-programmable gate array (FPGA) to an access lead network; and
   electrically connecting a stack of integrated circuits to the access lead network via a plurality of input/output (I/O) terminals disposed on a surface of the stack, wherein the access lead network is configured to route electrical signals between the FPGA and the stack.

18. The method of claim 17, wherein the FPGA is configured to utilize a variable word width.

19. The method of claim 18, wherein the variable word width is between 1 and m*N bits, where m represents a number of bits for a word width of each integrated circuit N represents the total number of the integrated circuits.

20. The method of claim 17, wherein said electrically connecting an FPGA to an access lead network comprises electrically connecting the FPGA to the access lead network using a first ball grid array, and wherein said electrically connecting a stack of integrated circuits to the access lead network comprises electrically connecting the stack of integrated circuits to the access lead network using a second ball grid array.

21. The method of claim 20, wherein the access lead network comprises a plurality of vias configured to electrically connect the first ball grid array to the second ball grid array.

22. The method of claim 17, wherein said electrically connecting an FPGA to an access lead network comprises electrically connecting the FPGA to the access lead network using a first pin grid array, and wherein said electrically connecting a stack of integrated circuits to the access lead network comprises electrically connecting the stack of integrated circuits to the access lead network using a second pin grid array.

23. The method of claim 17, wherein the access lead network comprises a plurality of metallized traces, and wherein said electrically connecting a stack of integrated circuits to the access lead network further comprises electrically connecting the plurality of metallized traces to the plurality of I/O terminals.

24. The method of claim 23, wherein at least one of the plurality of I/O terminals is electrically connected to at least one of the plurality of metallized traces by a T-connect structure.

25. The method of claim 17, wherein the plurality of integrated circuits comprise a plurality of vertically-stacked prepackaged IC chips.

26. An electronic module comprising:
   a field-programmable gate array (FPGA) electrically connected to a stack of printed circuit board (PCB) assemblies having ball grid array packages connected thereto; and
   a plurality of input/output (I/O) terminals disposed on a surface of the stack, wherein the I/O terminals are configured to route electrical signals between the ball grid array packages and the FPGA.

27. The electronic module of claim 26, further comprising a first memory integrated circuit (IC) mounted to a first side of one of the PCB assemblies.

28. The electronic module of claim 27, further comprising a second memory IC mounted to a second side of the one of the PCB assemblies.

29. The electronic module of claim 28, wherein the second side is opposite the first side.

30. The electronic module of claim 26, wherein the FPGA is configured to operate with a variable word width, wherein the variable word width is between 1 and m*N bits, where m represents a number of bits in a word width of a memory integrated circuit and N represents a number of memory integrated circuits.

31. The electronic module of claim 26, further comprising a metallized trace configured to electrically connect at least one of the plurality of I/O terminals to the FPGA.

32. The electronic module of claim 31, wherein the at least one of the plurality of I/O terminals is electrically connected to the metallized trace by a T-connect structure.

* * * * *

UNITED STATES PATENT AND TRADEMARK OFFICE
CERTIFICATE OF CORRECTION

PATENT NO. : 7,902,879 B2  Page 1 of 1
APPLICATION NO. : 12/639625
DATED : March 8, 2011
INVENTOR(S) : Ozguz et al.

It is certified that error appears in the above-identified patent and that said Letters Patent is hereby corrected as shown below:

On the Title page, item (75), under "Inventors", Line 1, delete "Aliso Veijo," and insert
-- Aliso Viego, --.

On the Title page, item (75), under "Inventors", Line 5, delete "San Clemete," and insert
-- San Clemente, --.

Signed and Sealed this
Twenty-eighth Day of June, 2011

David J. Kappos
*Director of the United States Patent and Trademark Office*